United States Patent [19]

Munekata

[11] Patent Number: 5,191,223

[45] Date of Patent: Mar. 2, 1993

[54] DEVICE FOR SELECTIVE MAGNETIZATION AND METHOD

[75] Inventor: Hiroo Munekata, Mahopac, N.Y.

[73] Assignee: International Business Machines Corporation, Armonk, N.Y.

[21] Appl. No.: 725,850

[22] Filed: Jul. 3, 1991

[51] Int. Cl.$^5$ .................. H01L 27/22; H01L 29/82; H01L 29/96; H01L 43/00
[52] U.S. Cl. .................................. 257/421; 257/425
[58] Field of Search ..................... 357/27, 23.2, 30 B

[56] References Cited

U.S. PATENT DOCUMENTS 4,823,177 4/1989 Prinz et al. ............................. 357/27
4,966,445 10/1990 Takeda .................................. 359/484

OTHER PUBLICATIONS

Story, T., et al. "Magnetism and Band Structure of the Semimagnetic Semiconductor Pb-Sn-Mn-Te", *Physical Review B*, 42(16):477 (1990).
Munekata, H., et al., "Epitaxy of III-V Diluted Magnetic Semiconductor Materials", *J. Vac. Sci. Technol. B*, 8(2):176 (1990).
Munekata, H., et al., "Diluted Magnetic III-V Semiconductors", *Physical Review Letters*, 63(17):1849 (1989).
Swagten, H. J. M., et al., "Hole Density and Composition Dependence of Ferromagnetic Ordering in Pb-Sn-Mn-Te", *Physical Review B*, 37(16):9907 (1988).
Masek, J., et al., "A Tight-Binding Study of the Electronic Structure of MnTe", *J. Phys. C.*, 20(1):59 (1987).
Denissen, C. J. M., et al., "Analysis of Some Magnetic Properties of Diluted Magnetic Semiconductors Including Long-Range Interactions", *Solid State Comms.*, 59(7):503 (1986).
Spalek, J., et al., "Magnetic Susceptibility of Semimagnetic Semiconductors: The High-Temperature Regime and the Role of Superexchange", *Physical Review B*, 33(5):3407 (1986).
Story, T., et al., "Carrier-Concentration-Induced Ferromagnetism in PbSnMnTe", *Physical Review Letters*, 56(7):777 (1986).
Furdyna, J. K., "Shallow Centers in Diluted Magnetic Semiconductors", *Solid State Comms.*, 53(12):1097 (1985).
Datta, S., et al., "Diluted Magnetic Semiconductor Superlattices and Heterostructures", *Superlattices and Microstructures*, 1(4):327 (1985).
Laff, R. A., "Semimetal-Semiconductor Heterojunction Devices", *IBM Technical Disclosure Bulletin*, 7(5):411 (1964).

Primary Examiner—Andrew J. James
Assistant Examiner—Sara W. Crane
Attorney, Agent, or Firm—Scully, Scott, Murphy & Presser

[57] ABSTRACT

A method and device are disclosed for converting electronic signals into magnetic signals in DMS materials by generating carriers in selected regions of the materials. The carriers comprise either holes or electrons and the concentration of the carriers in the DMS device is electronically and consequently reversibly controlled by varying the voltage supplied to the device. A carrier concentration-induced conversion of the DMS device is obtained in an area defined by an electrode so that the device of a selected area of the device is changed from one magnetic state to another magnetic state. A superexchange interaction through the carriers in the host DMS material causes a transition from one magnetic phase to another when the carrier concentration exceeds a critical value.

42 Claims, 9 Drawing Sheets

PARAMAGNETIC PHASE AT ZERO AND
WEAKLY REVERSE BIASES

FERROMAGNETIC PHASE AT FORWARD
BIASES

FERROMAGNETIC PHASE AT
HIGHLY REVERSE BIASES

DEVICE FOR SELECTIVE MAGNETIZATION AND METHOD

DESCRIPTION

1. Technical Field

The technical field of the invention is carrier induced magnetism in DMS devices in which the carrier concentration is electronically and consequently reversibly controlled by varying the voltage applied to the device. The technical field also includes binary code and write/read apparatus including optical modulator apparatus having capability as a "bit" transmitter based on such induced magnetism and methods for performing such write/read and binary code transmission functions.

2. Prior Art

Masek et al., *J. Phys. C.*, (GB), Vol. 20, No. 1, Jan. 10, 1987, pp. 59–68, describe a tight binding version of the itinerant spin fluctuation theory to explain the electronic structure of MnTe in both magnetically ordered and disordered phases. The authors predict that the change in magnetic phases will induce a change in the band structures involving the metal-insulator transition. The authors focus on the influence of spin exchange interaction of valence electrons on band structures. The change in the phases, however, is arbitrarily performed so that a method to change the magnetic phase, and hence electronic properties, is not described.

Furdyna et al., *Superlattices Microstruct.*, Vol. 1, No. 4, 1985, pp. 317–34, and Furdyna, *Solid State Commun.*, (USA), Vol. 53, No. 12, March, 1985, pp. 1097–1101, describes the effect of spin exchange interaction between shallow centers and diluted magnetic semiconductors (hereafter "DMS") and localized magnetic moments. These phenomena are reviewed with respect to CdMnSe and p-type HgMnTe DMS materials.

Spalek et al., *Phys. Rev. B.*, (USA), Vol. 33, No. 5, Mar. 1, 1986, pp. 3407–18, describe a systematic experimental study of the high temperature susceptibility of CdMnSe, CdMnTe, and HgMnSe DMS materials.

Denissen et al., *Solid State Commun.*, (USA), Vol. 59, No. 7, August, 1986, pp. 503–7, describe specific heat susceptibility and magnetization of CdMnTe, CdMnSe, HgMnTe, and HgMnSe DMS materials.

Story et al., *Phys. Rev. Let.*, Vol. 56, No. 7, 17 Feb. 1986, pp. 777–79, describe the influence of charge-carrier concentration on the magnetic properties of PbMnSnTe DMS materials.

SUMMARY OF THE INVENTION

The present invention is based on the discovery that electronic signals can be converted into magnetic signals in DMS materials. The carriers comprise either holes or electrons and the concentration of the carriers in the DMS device is electronically and consequently reversibly controlled by varying voltage applied to the DMS device. The physics of the invention is a carrier concentration-induced conversion of the DMS device in an area defined by an electrode from one magnetic state to another magnetic state (e.g. from a paramagnetic phase to a ferromagnetic phase in a p-type DMS device). A superexchange interaction through the carriers in the host DMS material causes a transition from one magnetic phase to another when the carrier concentration exceeds a critical value.

BRIEF DESCRIPTION OF THE DRAWINGS

FIG. 3b comprises a plan view of FIG. 3a;

FIG. 4b comprises a band diagram for the device of FIG. 4a;

DETAILED DESCRIPTION OF THE INVENTION

Figure 1A:
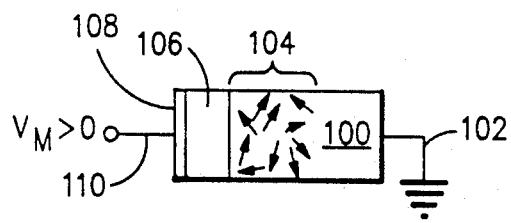
FIG. 1a is a cross sectional view of a p-type DMS device operatively associated with an electrical conductor, electrode and an insulator layer where the DMS device has a paramagnetic phase.

The invention comprises, in its broader aspect, an apparatus for controlling the magnetic properties of semiconductor material in a selected region comprising a DMS material, first means for introducing carriers into such material and second means for concentrating said carriers in the selected regions of the material above a critical value.

The second means may comprise either an insulator, a p-n junction or heterojunction formed with the DMS material. The DMS device may comprise either a III-V, II-VI DMS device or a DMS device containing a Group IV element such as a IV-VI DMS material and elemental semiconductors e.g. $Si_{1-x}M_x$, $Ge_{1-x}M_x$ and the like where "M" is a magnetic ion. An anomalous Hall effect semiconductor device may also be employed.

Another aspect of the invention relates to a method of switching a DMS device to a write mode or a read mode by applying an external magnetic field to the device; applying a bias signal to selected regions of the device to change the magnetic domains in the selected regions and thereby obtain a write mode; applying an electromagnetic signal to the device and measuring any alteration of the electromagnetic signal after applying it to the device to thereby obtain the read mode.

In the apparatus of the present invention, the means for introducing carriers such as holes or electrons into the DMS material comprises an electrical contact operatively associated with the DMS device for applying a positive or negative voltage whereas the additional means adapted for coupling to a first reference potential will comprise a ground which is also associated with the DMS device.

Further, with regard to the apparatus, the means for concentrating and depleting the carriers in the selected region of the DMS material comprises an electrode operatively associated with said electrical contact for introducing carriers into the DMS material especially an electrode spaced apart from the material where the spacing means comprise either an insulator, a heterojunction, such as a p-n heterojunction, a non-DMS/DMS heterojunction or a p-n homo junction.

Examples of various materials that may be employed to space the electrode from the DMS material comprise (Ga,Al)As positioned between the electrode and the material or a layer of GaAs or InGaAs formed over the DMS material. The junctions can be formed by MBE or CVD techniques known in the art.

Some examples of the various DMS materials that may be employed in the apparatus and according to the method of the invention comprise the following:

II-VI based diluted magnetic semiconductors such as:
(Zn,Fe)Se;
(Zn,Mn)Se;
(Zn,Fe)Te;
(Zn,Mn)Te;
(Cd,Mn)Te;
(Cd,Mn)Se;
(Cd,Hg,Mn)Te;
and their alloys in forms of $(II_1,II_2)_{1-x}M_x(VI_1, VI_2)$ where M=transition metals;

III-V based diluted magnetic semiconductors such as:
(In,Mn)As;
(Ga,Mn)As;
(Ga,Fe)As;
(In,Fe)As;
(Ga,In,Fe)As;
(In,Ga,Mn)As;
(In,Mn)Sb;
(In,Fe)Sb;
and their alloys $(III_1, III_2)_{1-x}M_x(VI_1, VI_2)$ where "M" is defined above;

IV-VI based diluted magnetic semiconductors $IV_{1-x}MVI$ where "M" is defined above such as:
PbMnTe;
and their alloys; and IV based materials, $IV_{1-x}M$ where "M" is defined above such as:
$(SiC)_{1-x}M_x$;
$(SiGe)_{1-x}M_x$;
$Ge_{1-x}M_x$;
$Si_{1-x}M_x$;
$(Si_{1-x}Ge)_{1-y}M$; and
SiGe.

As noted before, a new class of DMS based on III-V compounds prepared by utilizing molecular beam epitaxy (MBE), as exemplified by the (In,Mn)As alloy system can also be employed in the device and method of the invention.

Figure 6:
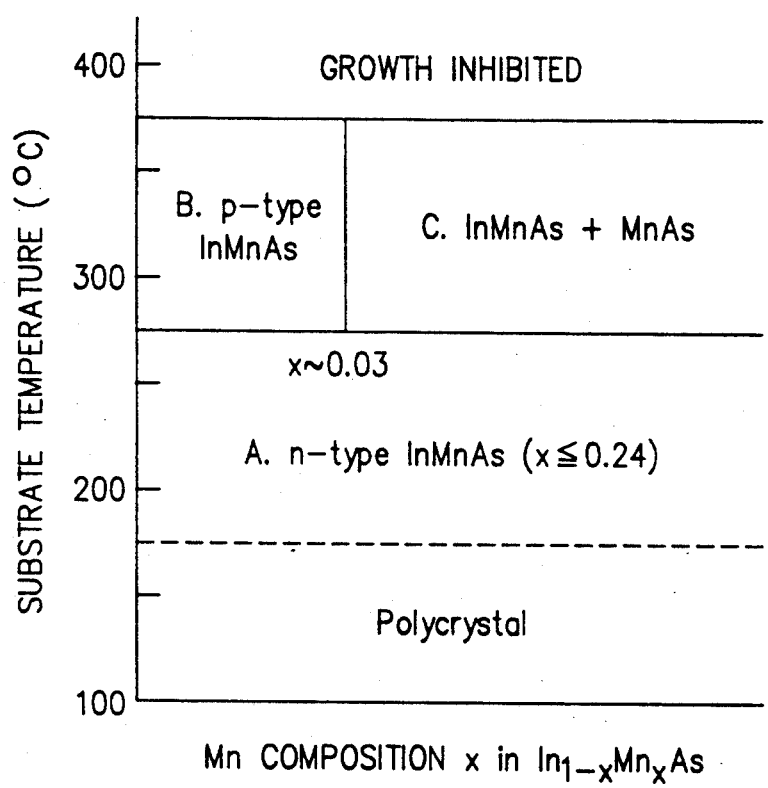
FIG. 6 comprises a graph of the various compositions obtained when growing an InMnAs DMS material by an MBE method employing substrate temperatures from about 200° to about 400° C.

As shown schematically in FIG. 6, the physical properties of epitaxial (In,Mn)As films are very sensitive to the growth parameters, especially the substrate temperature $T_x$ and Mn composition x, and they can be classified into three different regions; namely, an n-type homogeneous (In,Mn)As alloy (region A), a p-type homogeneous (In,Mn)As alloy (region B), and an inhomogeneous alloy composed of MnAs clusters imbedded in (In,Mn)As (region C). The discovery of region A was the first experimental evidence for the formation of homogeneous DMS III-V semiconductors. Region C was found together with region A, and it is characterized by the presence of ferromagnetic MnAs clusters with a Curie temperature of ~310K. Region B was observed later in connection with the anomalous transport behavior, in which the strong interaction of holes with local magnetic moments causes a carrier induced magnetic order in p-type materials.

Homogeneous n-type films of region A in FIG. 6 result from the growths at the relatively low substrate temperature of $T_s$~200° C., where surface segregation and precipitation of Mn are drastically suppressed yet single-crystal epitaxial growth is maintained. Reflection high energy electron diffraction usually shows a $(2 \times 1)$ reconstructed streak pattern during the growth. The films with the x values of at least up to x=0.24 have been successfully grown.

Compositional analyses showed that the Mn composition increases monotonically with increasing Mn beam flux with the sum of In and Mn atomic ratios being one, as in $In_{1-x}Mn_xAs$. As expected for a diluted magnetic semiconductor (DMS), the films are predominantly paramagnetic over the temperature range of 1-300K.

The paramagnetic Curie temperature shifts monotonically with the x value, and is usually negative, reflecting the antiferromagnetic spin exchange between the Mn ions.

It has been known that the electronic configuration of Mn ions in the doping regime is $3d^5$ ($Mn^{2+}$) plus one hold. All the (In,Mn)As films grown at $T_s\sim 200°$ C., however, have a negative Hall constant over a wide temperature range of 1.4K–300K. Thermoelectric power at room temperature is also negative, confirming that conduction carriers are electrons. The number of electrons abruptly decreases with increasing x up to $x\sim 0.02$, beyond which the reduction becomes gradual.

As shown schematically in FIG. 6, there is a specific region B in the growth-parameter space defined by the substrate temperatures of $T_x > 275°$ C. and the Mn compositions $0 < x < 0.03$, where Mn ions serve the dual purpose of providing both local spins and conduction holes. In this region, MnAs-like cluster formation is well suppressed in contrast to region C (FIG. 6), making the films paramagnetic except at low temperatures where the carrier-induced ferromagnetism comes into play. Moreover, the number of extrinsic residual donors appears to be smaller than that grown at low substrate temperatures so that holes from $Mn^{2+}$ ions are sufficiently activated. For example, at a fixed x value, the conduction is usually n-type for films grown at $T_s = 200°-265°$ C., whereas p-type conduction takes place for samples grown at $T_s > 275°$ C.

In the region of low Mn compositions ($0.001 < x < 0.004$), the hole concentration increases monotonically with increasing x, reading the highest concentration of $p\sim 4\times 10^{19} cm^{-3}$ at $x=0.004$. This value is greater than the values obtained in the conventional Mn-doped III-V compounds. Beyond $x=0.004$, however, the number of holes decreases drastically with increasing x values. The reduction is more than one order of magnitude from $x=0.004$ to $0.026$, at which point the hole concentration is as low as $p\sim 3\times 10^{18} cm^{-3}$.

For a p-type sample with $x=0.0124$. Lowering the temperature from 300K, the resistivity first deceases, passing through a minima at around 100K, and then starts increasing relatively steeply, especially below 20K. In contrast, the Hall constant monotonically increases with decreasing temperature.

Further lowering the temperature (<10K) results in striking hysteretic characteristics in magneto-transport. For example, the Hall resistance $p_{xy}$ at 4.2K for the $x=0.0124$ sample exhibits a hysteretic loop within the field range of ±200 Oe. For the resistance component, a very large negative magnetoresistance was observed together with a symmetrical hysteresis. These results indicate that a ferromagnetic component exists in the films and that the $p_{xy}$-H curve is a reflection of magnetization through the anomalous Hall effect.

The ferromagnetic characteristics disappear completely under the condition in which holes are intentionally compensated by doping the sample with donor impurities. A p-type (In,Mn)As and n-type (In,Mn)As:Sn samples were prepared at $T_s = 300°$ C. with nearly the same Mn composition. Carrier concentrations at room temperature are $p=9\times 10^{18} cm^{-3}$ and $n=1.5\times 10^{18} cm^{-3}$, respectively. A clear hysteretic loop is observed in the former, whereas only a weak paramagnetic signal with some background is detected in the latter case. It is clear from these results, that MnAs clusters, in any size, cannot possibly be responsible for the effects, and that ferromagnetic order is induced by the presence of conduction holes. Superexchange spin interaction between Mn ions via holes appears to be stronger than the fundamental antiferromagnetic coupling between Mn ions in p-type materials.

Magnetization measurements of p-type samples showed that the hysteretic loop was followed by a gradual increase of magnetization toward saturation at $H\sim 4$ Tesla, consistent with polaronic behavior.

Growth and transport properties of InMnAs/InAs and InMnAs/AlSb heterostructures have also been examined. Although not wishing to be limited by any theory, the introduction of heterojunctions is expected to provide additional parameters in controlling the spatial confinement of both carriers and magnetic ions either in the same or in different layers, possibly involving dimensional effects on the spin exchange.

A sample containing an InMnAs/InAs multilayer structure was grown at $T_s = 300°$ C. on an InAs/GaAs(100) substrate. After the growth of the multilayers of 101 layers each, a 40 nm thick InAs cap layer was grown on top. A nominal Mn composition was aimed to be $x=0.1$ with a nominal layer thickness of 5 nm for both InAs and InMnAs. Sputtering off the layers down to the InAs buffer layer has confirmed that the number of peaks (101 peaks) coincides with the number of InMnAs layers with a constant oscillation period of 10 nm. It is also important to know that there is no significant Mn signal observed on the top InAs surface. These results indicate that, within the limit of resolution, interdiffusion and surface segregation of Mn are well suppressed to confine Mn ions to or in the InMnAs layers.

It has also been found in an InMnAs/AlSb heterojunction, a very pronounced and sharp hysteretic loop in the Hall resistance at 4.2K is obtained. The actual structure consists of InMnAs(20 nm)/AlSb(0.1–0.3 $\mu$m)/GaSb(0.3–1.0 $\mu$m), grown on a semi-insulating GaAs(100) substrate at $T_s = 520°$ C. for highly resistive AlSb and GaSb layers ($\sim 5\times 10^6$ $\Omega/\square$ at 4.2K), while at $T_s = 200°$ C. for the top InMnAs layer. The Mn composition is $x=0.1$. A very sharp, square loop indicates a very homogeneous magnetization reversal and a large magnetic anisotropy. Other features are its relatively low resistance ($\sim 1\times 10^3$ $\Omega/\square$) and positive Hall constant, both being opposite to those of n-type (In,Mn)As films.

The sharp hysteresis, remarkably, becomes softer and smaller by placing a 10 nm InAlAs (Al$\sim$0.15) spacer layer between the InMnAs and AlSb, and it diminishes completely at a spacer layer thickness of 20 nm. These results indicate that the observed behavior is not simply due to the size effect of InMnAs films alone.

All of the foregoing DMS materials including heterostructure systems, can be employed in the apparatus and according to the method of the present invention. The foregoing III-V materials such as (In,Mn)As is believed to be comparable to CdHgMnTe(Ie II-VI DMS materials) in optoelectronic applications but offers the advantage that material processing including controlling doping levels (or carrier types and concentrations) of (In,Mn)As is simpler and thus affords some advantage in ease of fabrication. In this respect therefore, the III-V DMS materials would be preferable to the II-VI DMS materials.

The method of the invention is based on the discovery that voltages applied to a DMS material governs its magnetic properties, and hence causes an electric-field-induced magnetization at a selective area in the DMS device. Although the inventor does not wish to be limited by any theory, it is believed that a carrier concentration-induced magnetic domain is produced that is different from the magnetic domains of the DMS material prior to the application of an emf, where a superexchange interaction through carriers in a host material causes a transition into the magnetic domain phases which are produced, when the carrier concentration exceeds a critical value. As noted before, the concentration is electronically and hence reversibly controlled by varying applied voltages through the DMS material.

This method is particularly applicable to changing the magnetic domains of a III-V DMS device by applying a forward bias or a reverse bias to selected regions of the device wherein the reverse bias is of a sufficiently high voltage so that the magnetic domains of the device are measurably changed. This method is also applicable to devices based on II-VI based, IV-VI based and elemental IV semiconductor based DMS materials.

In one preferred embodiment, the method is especially applicable to III-V DMS devices based on the Group III elements Ga or In, the Group V element As and at least one of the transition elements Co,Fe,Mn and especially at least Mn.

The method of the invention is applicable to such DMS devices to place them in a so-called "read" mode (or "off" or "zero" mode) and switch them from such "read" mode to a "write" mode, (or "on" or "one" mode) which is also sometimes referred to as off-on switching. Such off-on or zero-one binary code switching or read-write operation of the device renders it adaptable to performing switching operations in computers that perform computing functions utilizing binary language. The off-on rate or cut-off frequency of the apparatus and method of the present invention can be as high as 20 GHz.

The switching speed is influenced by two effects; one with the CR time constant of the device (CR=capacitance and resistance) and the other with relaxation time of the magnetic ordering. The former is quite fast, typically in the order of 10 E-13 to 10 E-12 seconds as estimated from carrier accumulation regions in a Si MOS structure. The latter is attributed to the spin-lattice interaction, and therefore is temperature dependent. At very low temperatures (1-4K), this process is rather slow (around $3 \times 10$ E-10 sec.) because the crystal lattice of the host material does not vibrate strongly enough to allow spins to relax quickly to the original magnetic state. The lattice vibration becomes stronger by increasing the temperature, and the spin relaxation times therefore are estimated to be $6 \times 10$ E-11 sec. at 77K and $2 \times 10$ E-11 sec. at room temperature. Accordingly, the overall switching speed (inverse relaxation time) is limited by the spin-relaxation time and is somewhere in the order of 3 GHz at low temperatures, 20 GHz at 77K and 50 GHz at room temperature. These switching speeds are also dependent to some degree on the elements employed in the DMS materials i.e. different combinations of materials and heterostructures may change these numbers somewhat. Cut-off frequencies of this order are especially desirable for high speed computer operation and optical communication. These high speeds have a two-fold effect in that size reduction and/or increased output can be obtained for computers and data processors that employ such devices.

Depending on the DMS material employed, the various devices or apparatus of the present invention can be operated over a broad temperature range. For example, devices using II-VI and IV-VI DMS systems, the working temperature would stay on the low side (below 77K) because of rather strong antiferromagnetic (A.F.) coupling between the magnetic ions, whereas near room temperature operation for the III-V DMS materials is possible. In the III-V DMS, however, the A.F. coupling is weak, presumably because of ferromagnetic coupling of As-Mn-As as in ferromagnetic MnAs. MnAs is a known ferromagnetic metal having a transition temperature at 320K and with a large number of carriers N (about 1 E18-10 E20 cm−3) material such as InMnAs and GaMnAs can cause super-exchange interactions between carriers and magnetic ions in addition with the As-Mn-As superexchange, and accordingly, the working temperature of the devices would be increased as N increases, resulting in the device operating close to room temperature. Other III-V DMS systems, for example those based on GaMnSb will have working temperatures somewhat higher where the degree of super-exchange interaction is stronger in Sb-Mn-Sb than in As-Ma-As; viz., a ferromagnetic metal MnSb has a transition temperature at around 500K.

Depending on whether or not the DMS device is a p-type device or n-device, the virgin or initial magnetic state of the DMS material will differ. In the case of p+-materials ($P \geqq 1 \times 10^{18} cm^{-3}$), the initial magnetic state will be ferromagnetic and after the application of a positive bias to an area of the DMS material, the area where the bias is applied will be depleted and in turn be converted to a paramagnetic state and possibly an antiferromagnetic state. Where the DMS material is a p−- or an n-DMS material, the virgin or original state of the DMS material will be paramagnetic and upon application of a negative bias to an area of the device, that area will accumulate carriers and form an interface of a substantially ferromagnetic state. Accordingly, by the application of a bias signal to selected regions of the DMS device, the original or virgin magnetic state in said selected regions will be changed to a magnetic state other than the original magnetic state. The changed magnetic domains in the selected regions can then be accessed by applying an electromagnetic signal to the changed magnetic domains and measuring any alteration of the electromagnetic signal after it is applied. Naturally, the electromagnetic signal is selected so that it will be altered by the changed magnetic domains in the selected regions.

The electromagnetic signal that is employed may comprise laser energy or laser light that is passed through the changed magnetic domains and detected by conventional detection means which may be separate or integral with the DMS device. Polarized light may be employed in substantially the same manner as the laser light or, alternately, polarized light reflected from the surface of the changed magnetic domains, the reflected light being measured by conventional detectors which again may be integral with the DMS device or separate from it.

The electromagnetic signal may also comprise the application of a voltage or an emf to the changed magnetic domains in the selected regions and the Hall resistance or voltage measured, the Hall effect being well known in the art.

When the alteration of the electromagnetic signal is measured after it is applied to the DMS device in order to obtain the read mode, the reference point from which the comparison is made is the state or nature of the electromagnetic signal prior to applying it to the changed magnetic domains and the altered signal is its nature or state after being applied to the changed magnetic domains in the device. For example, when polarized light is employed for reflection off of the changed magnetic domains, the extent of polarization of the incident light is compared to the reflected light and the difference in polarization will produce the read mode of the device. The same method is also employed for passing either laser light or polarized light through the changed magnetic domains except that the incident electromagnetic signal is compared to the transmitted signal. Similarly, when applying a bias or an emf to the changed magnetic domains through a probing contact, the voltage passed through the device prior to and after the magnetic domains are changed are compared and the Hall voltage or Hall resistance is determined.

Referring to the drawings and FIGS. 1a-f, illustrating a normally-off type p-DMS device a p-type DMS material 100 is illustrated having a ground or first reference potential 102 connected thereto, material 100 having paramagnetic domains 104 graphically illustrated by the randomly positioned arrows. An insulator 106 is positioned as illustrated and is operatively associated with the material 100 and a metal electrode 108, which in turn is operatively associated with an electrical lead 110.

Figure 1B:
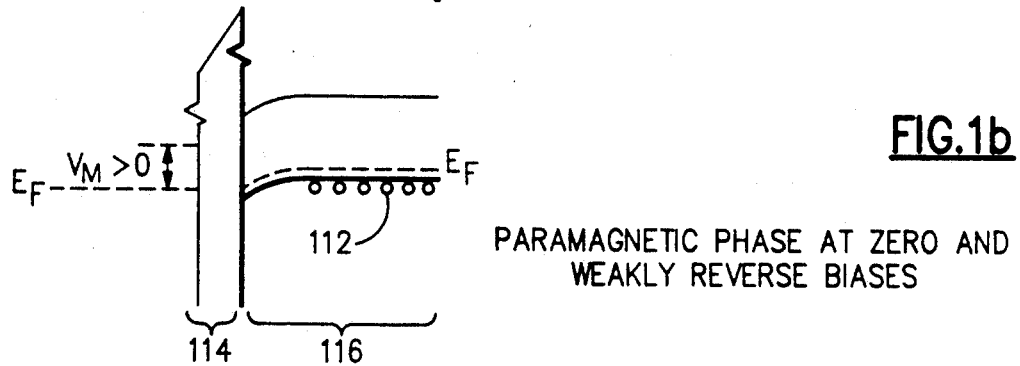
FIG. 1b comprises a band diagram of the device of FIG. 1a at zero and weakly reversed biases.
Figure 1C:
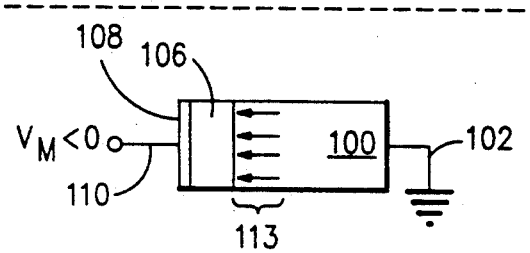
FIG. 1c comprises a cross sectional view of the DMS device of FIG. 1a showing a ferromagnetic phase at forward biases.
Figure 1D:
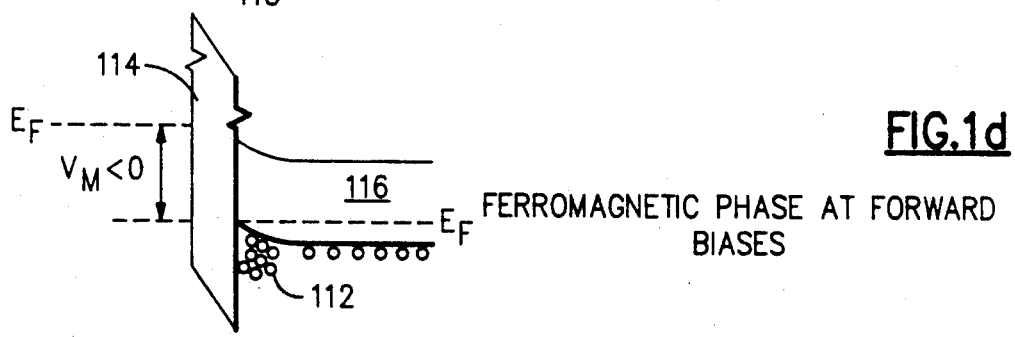
FIG. 1d comprises the band diagram of the device illustrated in FIG. 1c.
Figure 1E:
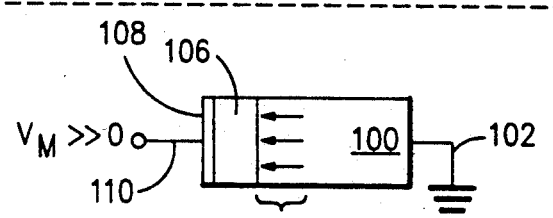
FIG. 1e comprises a cross sectional view of the device of FIG. 1a showing a ferromagnetic phase at a highly reversed bias.
Figure 1F:
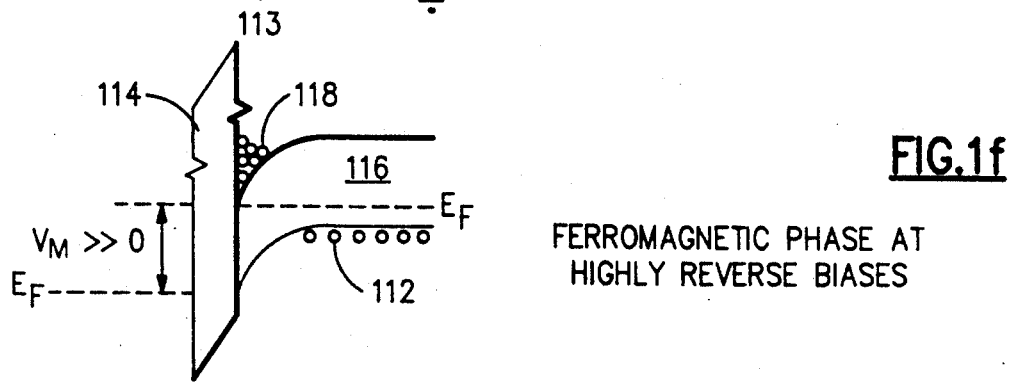
FIG. 1f comprises the band diagram of FIG. 1e.

The band diagrams FIGS. 1b, 1d and 1f illustrate by way of 114 the band for the insulator and by 116 the band for the DMS material 100. The upper line of the region 114 constitutes the conduction band of the insulator whereas the upper line of the region 116 is the conduction band of the DMS material. The lines at the bottom of regions 114 and 116 are the valence bands of the insulator and the semiconductor material. The Fermi band is also illustrated in a conventional manner.

The hole distribution 112 is illustrated in FIGS. 1b, 1d and 1f whereas electron distribution 118 is illustrated in FIG. 1f.

The DMS layer 100 is grown by vapor phase epitaxy techniques, such as molecular beam epitaxy or organo-metal vapor phase epitaxy on top of a conductive semiconductor substrate [p+-GaAs (100) for example] at the appropriate optimal substrate temperature. This is followed by either in-situ or ex-situ deposition of an insulator layer 106, a conventional photolithographic process to form metal pads 108, and wiring/packaging processes for wires/connectors 110 and 102.

The device thus illustrated in FIGS. 1a-1f is based on DMS materials that are typically thin films, on the order of from about 10 Å to about 50 μm and especially from about 100 Å to about 5 μm. The DMS materials as employed according to the invention will also comprise DMS films of the foregoing thickness.

Figure 2A:
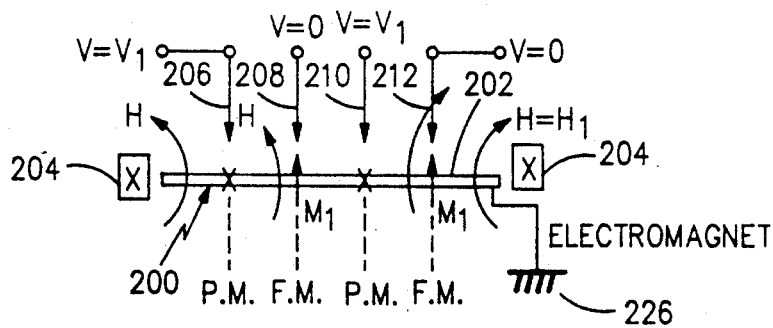
FIG. 2a comprises a cross sectional view of a magneto-electronic storage device comprising a DMS material having both paramagnetic and ferromagnetic domains and having electrical contacts operatively associated therewith, an electromagnet being positioned on the periphery of the device, the device being in a write mode.

FIG. 2a illustrates a magneto-electronic storage device 200 which includes a DMS material 202, an electromagnet 204 and electrical conductors 206, 208, 210 and 212 all of which are electrically connected to and operatively associated with the DMS 202. As set forth in FIG. 2a, the various designations P.M. and F.M. are used to indicate paramagnetic and ferromagnetic domains respectively, the ferromagnetic domains also containing arrows normal to the DMS material 202 as a further indication of this magnetic state.

Figure 2B:
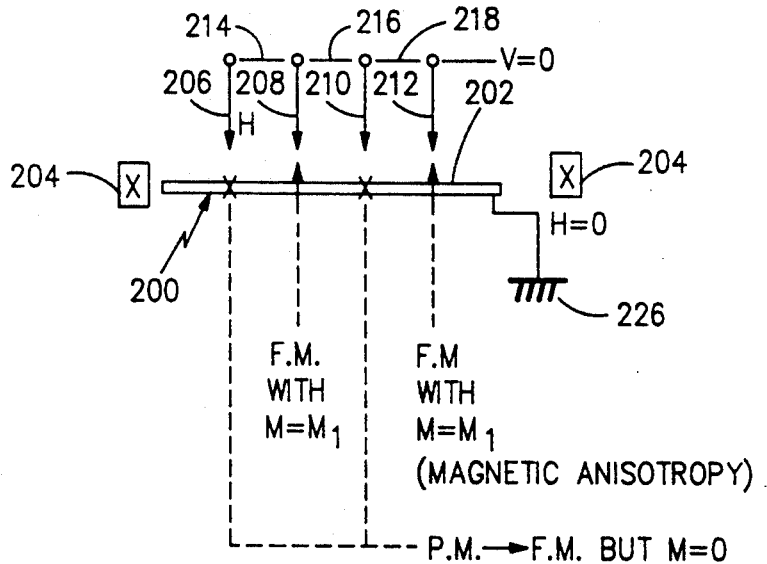
FIG. 2b comprises the DMS device of FIG. 2a in an information storage mode.
Figure 2C:
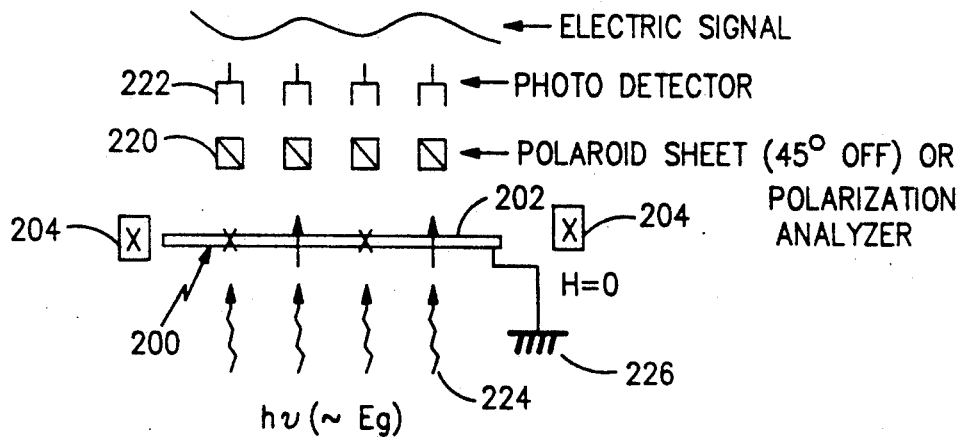
FIG. 2c comprises the DMS device of FIG. 2a in an optical read mode.

FIG. 2b further illustrates the device of FIG. 2a with the various conductors 206, 208, 210 and 212 being interconnected by switching numbers 214, 216 and 218. FIG. 2c comprises the device of FIG. 2a (the conductors 206-212 having been removed for clarity of the Figure) and illustrates linearly polarized light 224 being directed through the DMS material 202 which passes the transmitted light through to a plurality of polaroid sheets (45° off) or a polarization analyzer, the linearly polarized light 224 subsequently being detected by the various photodetectors 222.

Figure 2D:
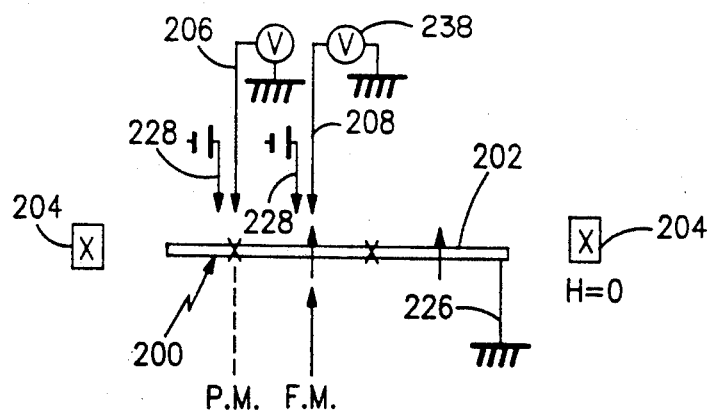
FIGS. 2d and e comprise the DMS device of FIG. 2a in an electrical read mode.

FIG. 2d further illustrates the device of FIG. 2a and an electrical read out in which switchably probe contacts are operatively associated with the surface of the DMS material 202. The probe contacts either directly abut the surface of the device or can be positioned above the DMS device no more than about 1 μm above the surface thereof. In an alternate embodiment a scanning probe (not illustrated) so arranged can be employed to scan the surface of the DMS material in a manner well known in the art.

Figure 2E:
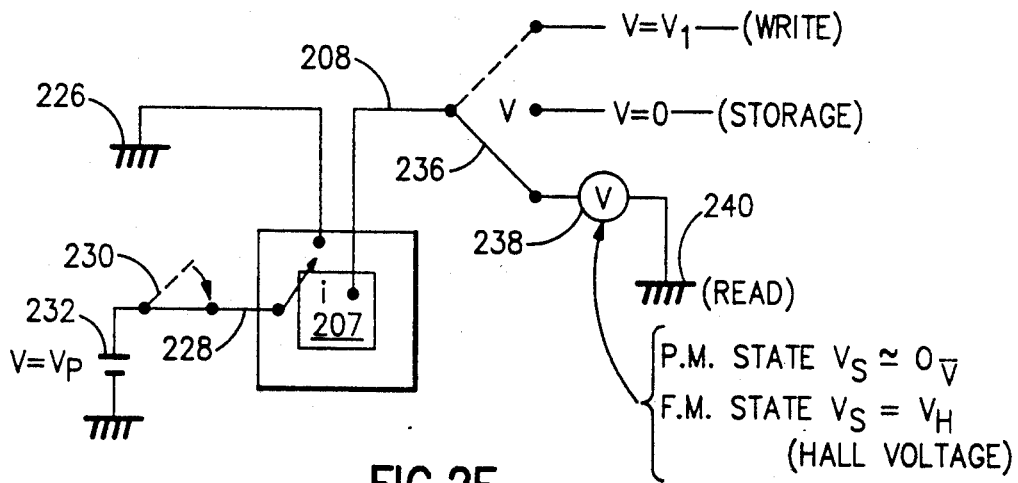

Referring to FIG. 2e, a plan view of the device of FIG. 2d is shown in which the probe 228 is placed adjacent an electrode 207, probe 228 being switchably connected through switch 230 to voltage source 232 which in turn is operatively connected to ground 234. Electrical connector 208 is operatively connected to voltage V=V1, V=0 and a volt meter 238 through switch 236, volt meter 238 being operatively connected to ground 240.

Figure 3A:
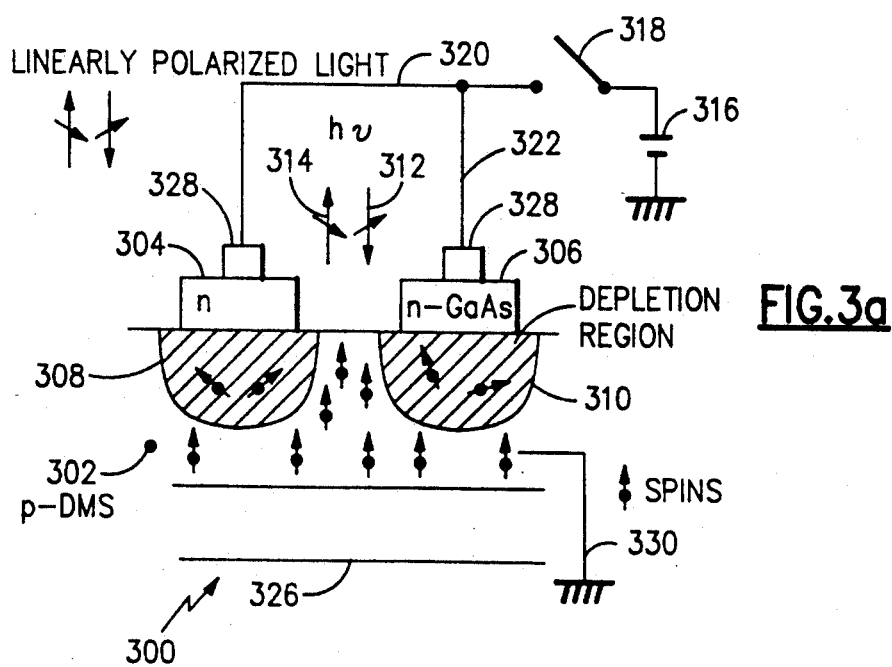
FIG. 3a comprises a cross sectional view of a junction field-effect device based on a p-DMS material normally in the on mode only.

FIG. 3a illustrates another aspect of the invention as a high-speed light modulator in optical data processing which comprises a junction field-effect device 300 in which a p-DMS material 302 which is ferromagnetic as indicated by the magnetic domains represented by a plurality of arrows all pointed upwardly towards the surface of the device. N-junctions 304 and 306 are operatively associated with the p-DMS 302, the regions 308 and 310 extending beneath the n-junctions 304 and 306 comprising carrier-depleted regions 308 and 310 containing paramagnetic domains which are illustrated by the randomly pointing arrows in those regions 308 and 310. A light source is also provided to direct linearly polarized light at the device 300, the incident light in this respect is illustrated by 312 whereas the reflected light is illustrated by 314. The n-junctions 304 and 306 are operatively associated with a voltage source 316 through switch 318 and conductors 320 and 322.

The p-DMS layer 302 is grown by vapor phase epitaxy techniques or ion implantation of magnetic ions into a non-magnetic host semiconductor layer on top of a semi-insulating substrate. This is followed by in-situ epitaxy of a n-type semiconductor layer, ex-situ conventional photolithography and etching process to form n-type mesa regions 304 and 306. The structure is then processed for n-type ohmic contacts 328, wiring/packaging for 316, 318, 320, and reference contact 330.

Figure 4A:
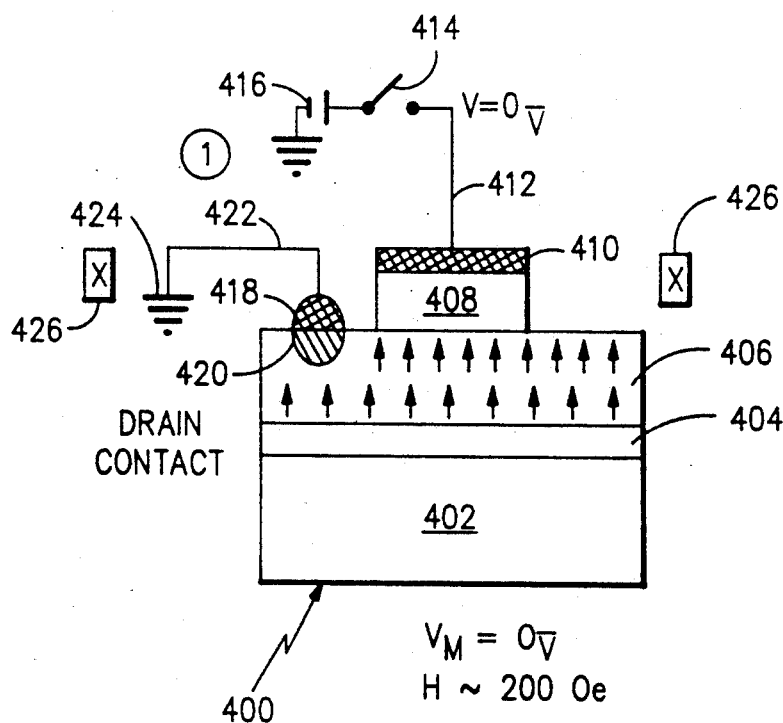
FIG. 4a comprises a cross sectional view of a normally-on type DMS device based on a $p^+$-DMS material having electrical contacts operatively associated with a conducting metallic contact and a drain contact, the conducting metallic contact being operatively associated with the DMS material through a blocking and/or insulating layer said DMS material extending downwardly to a buffer layer, said buffer layer being mounted on a substrate material wherein the device is magnetized ferromagnetically.

FIG. 4a illustrates a normally-on type p+-DMS device 400 having a GaAs substrate 402, a GaAs or (In,-Ga)As buffer layer 404, a 1 μm p+-(Ga,Mn)As or p+-(In,Ga,Mn)As layer 406, a blocking layer 408 being positioned over layer 406, the blocking layer 408 comprising (Ga,Al)As or $SiO_2$ or $Si_3N_4$ as an insulating layer about 1,000 Å. A conducting metallic contact or electrode 410 is positioned over layer 408, an electrical lead 412 being operatively and electrically associated with contact 410 through switch 414 which is connected to a voltage source 416. A drain contact 418 which forms an ohmic contact 420 in said layer 406 is positioned as illustrated and is electrically connected to ground 424 through electrical lead 422. An electromagnet 426 is positioned next adjacent the device 400.

Figure 4B:
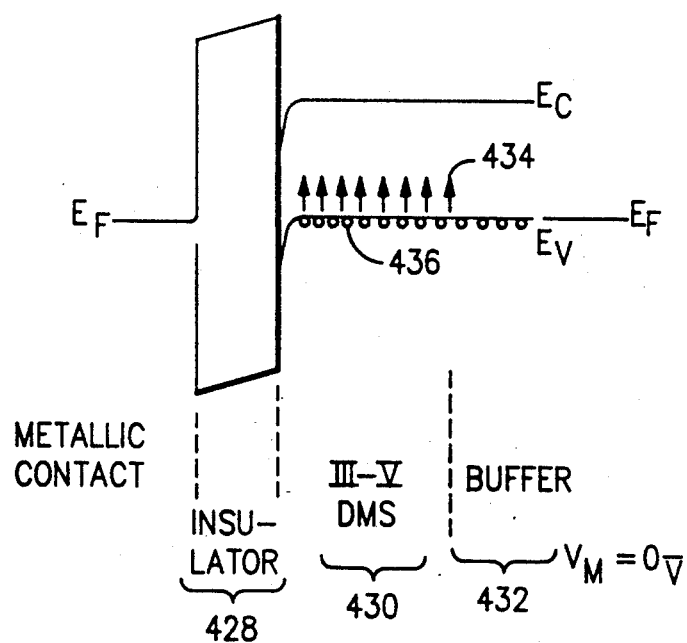

FIG. 4b comprises a band diagram for the device illustrated in FIG. 4a the region 428 comprising the band diagram for the insulator or blocking layer 408, the region 430 comprising the band diagram for the DMS material of 406 and the region 432 comprising the band diagram for the buffer region 408. The magnetic spins of the Mn ions is illustrated by the upwardly pointing arrows 434 whereas the holes are represented by the circles 436. The conduction bands, Fermi level and valence bands are also conventionally labeled and illustrated.

Figure 4C:
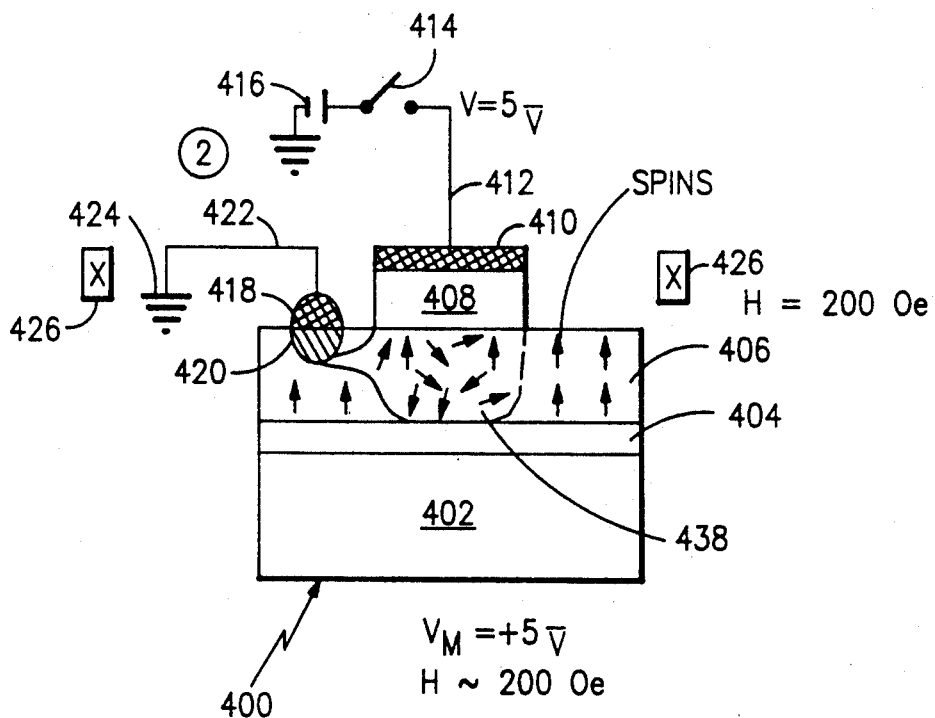
FIG. 4c comprises the device of FIG. 4a in a positive bias configuration.

FIG. 4c is a further illustration of the device 400 in which a positive bias is applied (V=5 V) whereby holes under the blocking layer 408 are depleted so that they are altered from a ferromagnetic state to a paramagnetic state, thus forming a paramagnetic region 438 as illustrated by the various arrows pointing in random directions in the region 438.

Figure 4D:
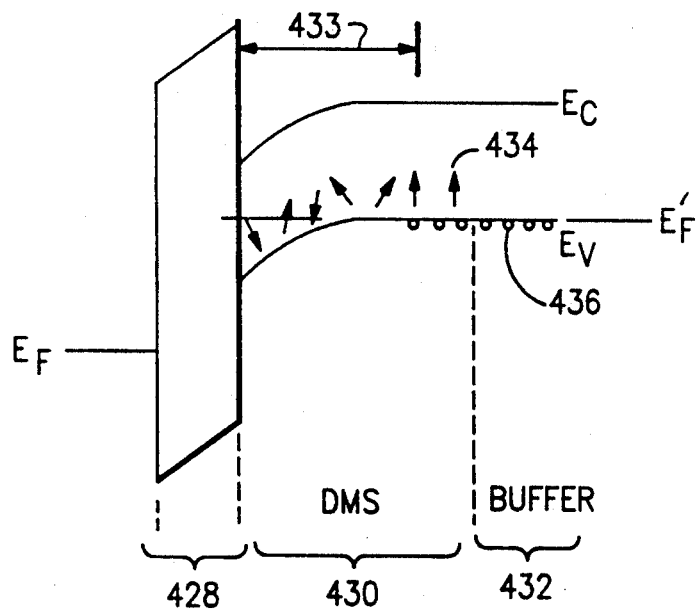
FIG. 4d comprises the band diagram for FIG. 4c.

FIG. 4d comprises a band diagram for the device illustrated in FIG. 4c, the spins 434 being both random and ordered, the former indicating the paramagnetic zone that is formed in region 438 whereas the latter illustrates the ferromagnetic domains that remain unchanged in layer 406. The holes 436 are also depleted from the original region illustrated as 430 in FIG. 4b, and FIG. 4d.

Figure 5A:
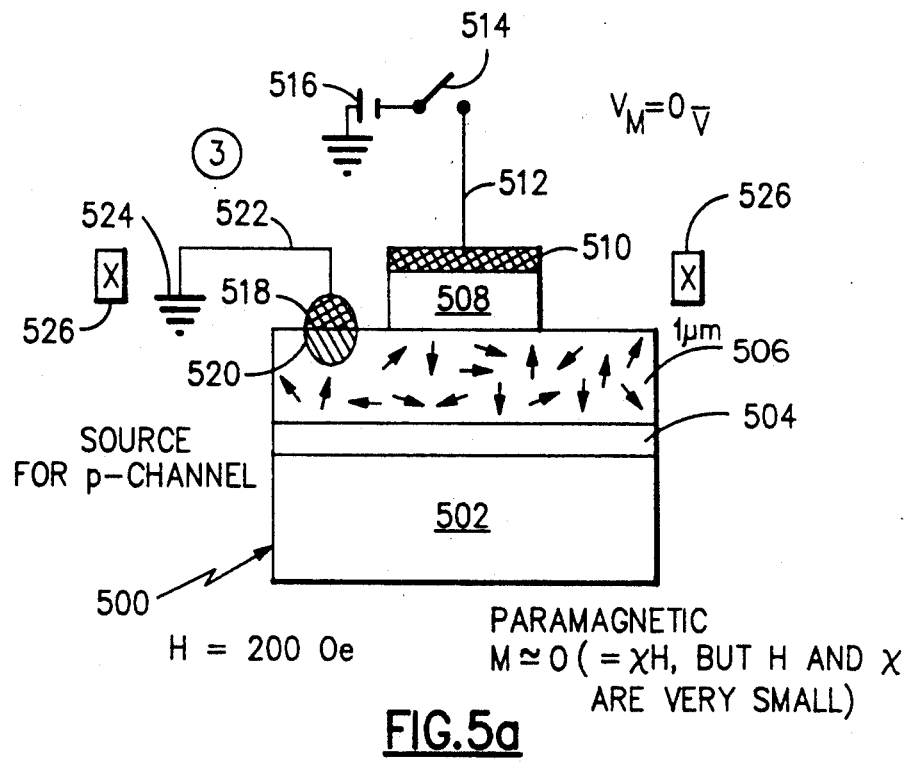
FIG. 5a comprises a cross sectional view of a normally-off type DMS device based on a $p^-$- or n-DMS material having electrical contacts operatively associated with a conducting metallic contact and a drain contact, the conducting metallic contact being operatively associated with the DMS material through a blocking and/or insulating layer said DMS material extending downwardly to a buffer layer, said buffer layer being mounted or deposited on a substrate material wherein the device is magnetized ferromagnetically.

FIG. 5a is a sectional view of a normally-off type DMS apparatus 500 according to the present invention based on either $p^-$- or n-DMS materials and comprises a GaAs substrate 502 having a buffer layer 504 mounted thereon comprising GaAs or (Ga,In)As as a buffer layer with either $p^-$- or n-type doping, layer 504 in turn having a 1 μm layer 506 comprising a $p^-$- or n-(Ga,Mn)As or (Ga,In,Mn)As composition cover layer 506 in turn having mounted thereon a further layer 508 composed of either (Ga,Al)As or an insulator layer comprising $SiO_2$ or $Si_3N_4$ materials. Layer 508 in turn has a metallic contact 510 positioned thereon and operatively associated therewith. Electrical conductor 512 leads out of the metallic contact 510 and into switch 514 which is operatively associated with a voltage source or emf 516. A source region 520 which is p-type and capable of forming a p-channel is provided which extends into layer 506 said source region extending upwardly to p-type ohmic metallurgy 518 which is electrically grounded through electrical conduit 522. An electromagnet is illustrated at 526.

Figures 5B, 5C:
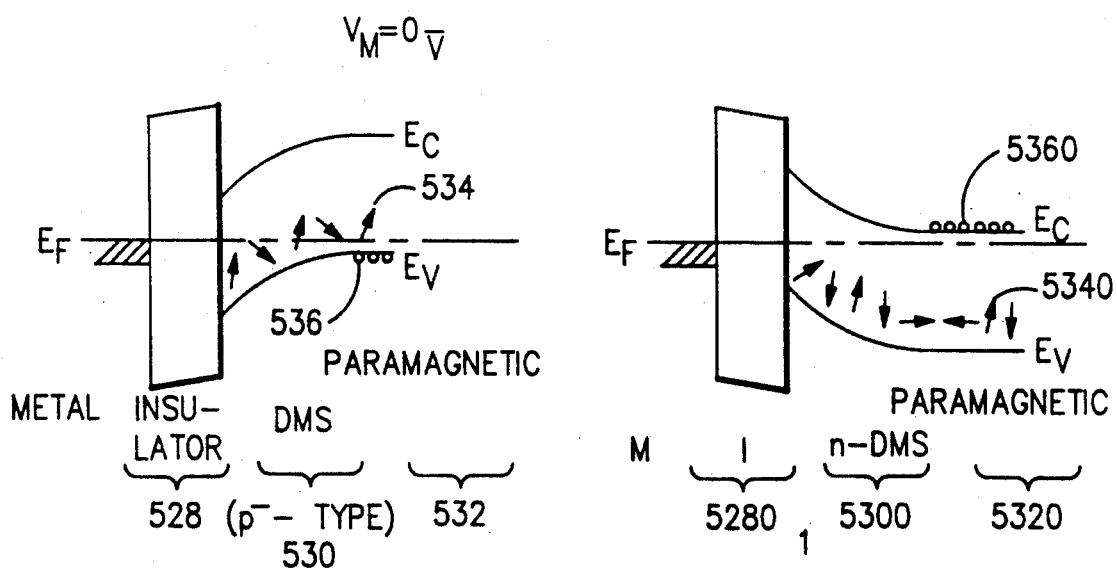
FIG. 5b comprises the band diagram of the device shown in FIG. 5a where the DMS is a $p^-$-type.
FIG. 5c comprises a band diagram of the device of FIG. 5a where the device is based on an n-DMS material.

FIG. 5b is a band diagram for the device shown in FIG. 5a where the DMS material is a $p^-$-type material and defines the insulator properties by region 528, the DMS properties by region 530 and the buffer properties by region 532. The random spins or the paramagnetic domains are illustrated by the randomly pointing arrows 534 whereas the holes are illustrated by the small circles 536.

FIG. 5c comprises a band diagram for the device of FIG. 5a where the DMS material is an n-type DMS substance the band properties for the insulator being shown in region 5280, the n-DMS material in region 5300, the buffer region at 5320 and the random spins indicating the paramagnetic material by the randomly pointing arrows 5340. The electrons are illustrated at 5360. The Fermi energy level, the conduction band and the valence band for the insulator, DMS material and the buffer layer in FIGS. 5b and 5c are illustrated and represented in a conventional manner.

Figure 5D:
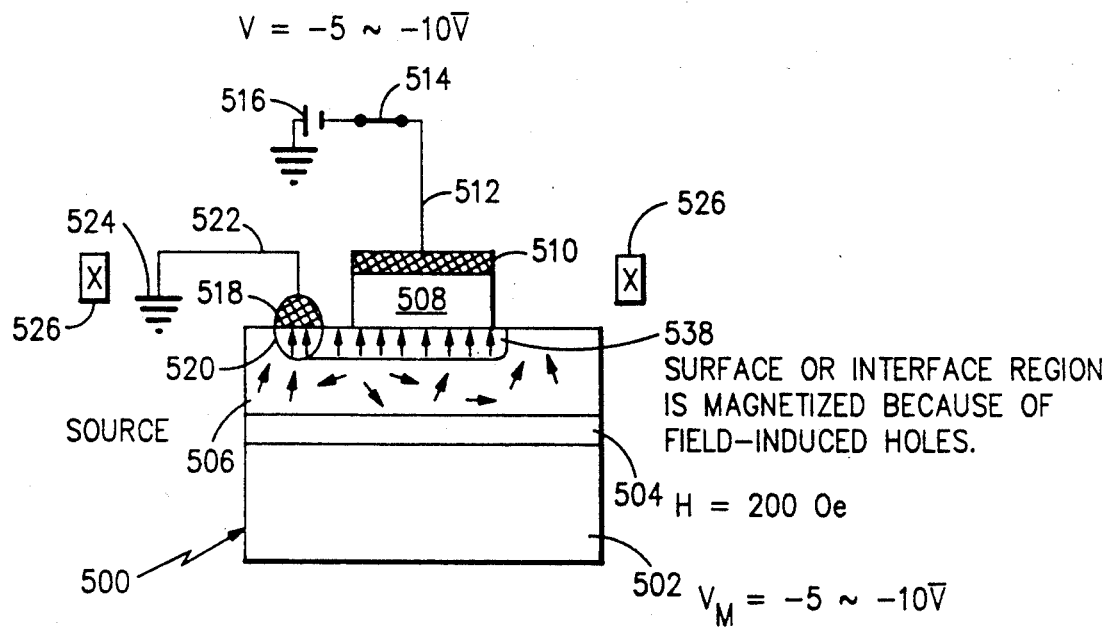
FIG. 5d comprises an illustration of the device of FIG. 5a in an "on" configuration.

FIG. 5d comprises an illustration of the device of FIG. 5a which is biased by a voltage of from about −5 V to about −10 V and illustrates the generation of ferromagnetic domains 538 as illustrated by the arrows in FIG. 5d all pointing in the same direction, the other randomly pointing arrows in the layer 506 illustrating paramagnetic domains. The ferromagnetic ordering, as can be seen from the region 538, is at a surface or interface region which is magnetized because of field-induced holes.

Figures 5E, 5F:
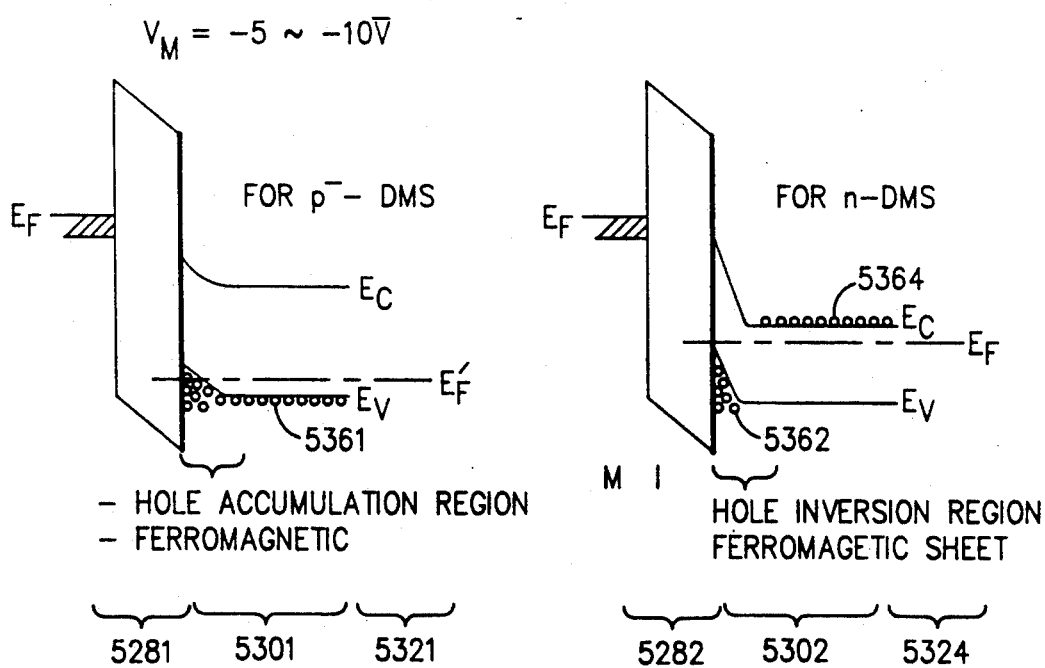
FIG. 5e is a band diagram for the device of FIG. 5d where the device is based on a $p^-$ -DMS material.
FIG. 5f comprises a band diagram for the device of FIG. 5d where the device is based on an n-DMS material.

FIG. 5e comprises a band diagram of the device as operated in FIG. 5d where the device comprises a $p^-$-DMS material, region 5281 comprising the band diagram for the insulator layer, region 5301 comprising the band for the DMS layer and region 5321 comprising the band region for the buffer area. A hole accumulation is illustrated by the cluster of holes 5361 at the juncture of the band diagram for the insulator and the band diagram for the DMS material.

FIG. 5f comprises a band diagram for the operation of the device illustrated by FIG. 5d where the device is based on an n-DMS material. Region 5282 comprises the band diagram for the insulator layer, region 5302 comprises the band diagram for the DMS material and region 5324 comprises a band diagram for the buffer layer. As can be seen by reference to FIG. 5f, a hole inversion region is formed by the holes 5362 at the junction of the insulator band region and the DMS band region. It should also be noted that electrons are present as illustrated at 5364. The Fermi energies, conduction bands and valence bands are conventionally illustrated and represented for the device in both FIGS. 5e and 5f.

In use, and referring to FIGS. 1a–1f, the device 100 has paramagnetic regions as illustrated by the arrows 104 pointing in random directions at zero and weakly reversed biases (i.e. where the $V_m$ terminal is positive). Referring to FIG. 1c as a forward or negative bias is applied to the device 100 by making the $V_m$ terminal negative, a ferromagnetic phase is developed as illustrated by arrows 113 pointing in the same direction which, as can be seen by comparing the band diagrams of FIG. 1b and FIG. 1d, results in an accumulation of holes 112 at the junction of the insulator and the DMS device. Further, the ferromagnetic phase can also be developed at a highly reversed bias but will result in an accumulation of electrons 118 at the junction of the insulator and the DMS device as illustrated in the band diagram of FIG. 1f. An external magnetic field can also be applied (not illustrated) to strengthen the effect obtained by applying the aforesaid forward and reverse biases whether the material is a III-V, II-VI, IV-VI or other DMS material as described herein.

Referring to FIGS. 2a–2c, a magneto-electronic storage device 200 is illustrated which uses carrier-induced magnetization. The device of FIG. 2a et seq. is put into a write mode when the electromagnet 204 is turned on and a field of about 200 Oe is applied. The voltage introduced into the device through conduits 206 and 210 is turned on and off. The domains (mesa) where the voltage V=0 is strongly magnetized (ferro) while when $V=V_1$ the magnetization is very small and virtually zero magnetization because of the formation of paramagnetic domains due to the absence of carriers. In contrast, magnetization is strong at the point V=0 because of spin alignment in the ferromagnetic region due to the carrier-induced ferromagnetism.

Referring to FIG. 2b, the device of FIG. 2a is illustrated in an information storage mode in which the magnetization is either zero or 100 Oe and the voltage off. The various switches 214, 216 and 218 are employed to connect conductors 206, 208, 210 and 212 where the voltage is at zero potential. The magnetized domain in the device 200 will hold its $M_1$ because of remanent magnetization and will thereby perform a storage function. By turning off the voltage, the paramagnetic domains will go back to the ferromagnetic state, but M subtotal will be zero because it reverts to its virgin state with M=0.

The device originally in the "write" or "zero" mode in binary code when thus configured is in the "read" or "one" mode in binary code and can be read either by optical means or electrical means. Because of the remanent magnetization, the device 200 will function as a storage device as well. Referring to FIG. 2c, linearly polarized light 224 is passed through the device 202, through polaroid sheet 220 which is offset at a 45° angle. A polarization analyzer can be used in lieu of the sheet 220. Photodetectors 222 (or polarization analyzers) are positioned on the opposite side of the sheet 220 and the change in optical rotation, whether Faraday rotation or Voigt effect is measured. Faraday rotation comprises the rotation of polarization of a beam of linearly polarized light when it passes through matter in the direction of a magnetic field. Voigt effect is the double refraction of light passing through a substance that is placed in a magnetic field perpendicular to the direction of light propagation. Whether Faraday rotation or Voigt effect are to be measured, the polarized light will be passed through material 202 in a manner suitable to obtain either effect and the analyzers and/or detectors also suitably arranged to make either measurement according to methods well known in the art.

The light passes through the ferromagnetic region and polarization angle rates of about 0.1° to 0.5°/1–5 $\mu$m would be obtained. This change is converted to a change in transmitted light through the polaroid sheet 220 or a polarization analyzer, the change of transmission being from about 0.4% to about 2.0% per 0.1°. Transmitted light is then caught by the photodetectors 222 and the light signals converted into an electrical signal. The change of about 0.4% to about 2.0% can be amplified electrically, for example by using a Si pin photodetector technique.

In order to measure the change of the device electrically, one additional contact (probe 220) or a plurality of contacts are amounted on the device 202. Hall voltage or Hall resistance can thereby be measured through the application of a small probing voltage $V_p$ applied between the probe contacts 228 and the reference contact 226. This will produce a small probing current between 228 and 226 producing voltage signals Vs between read/write contacts 206, 208, 210, 212 and reference contact 226. At the point under the P.M. state of the device, $V_s$ is a resistance between probing contact 228 and electrical contact 226 and is virtually small, but for the point under the F.M. state, $V_s$ measures a resistance plus Hall resistance generated at the point and is thus large. This measurement is obtained by applying voltage from source 232 to the appropriate contact, 228 by operatively engaging switch 230 in a conventional manner, the voltage being determined by volt meter 238 when switch 236 operatively connects the volt meter to connector 208.

Hall voltage or Hall resistance will be measured through the read/write contact 208 with respect to the reference contact 226 in a manner well known in the art.

Figure 3B:
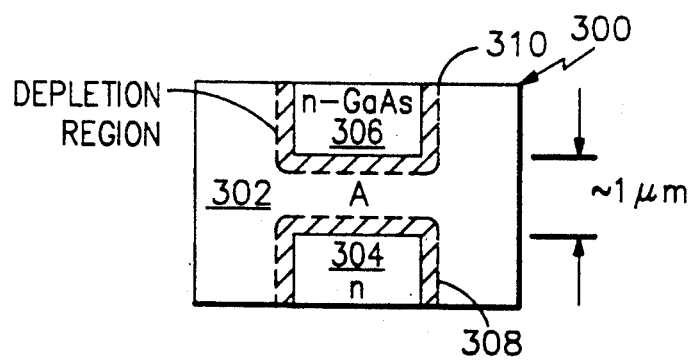
Figure 3C:
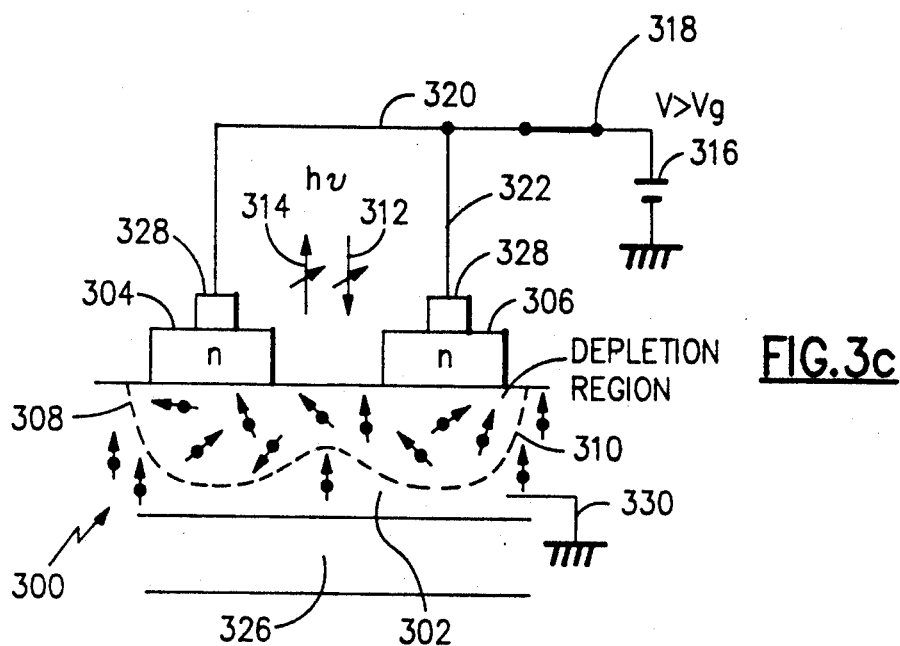
FIG. 3c comprises the device of FIG. 3a biased above the pinch-off $V_g$ voltage.
Figure 3D:
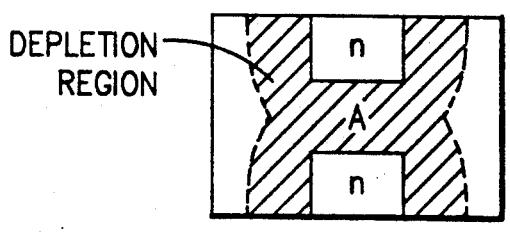
FIG. 3d comprises a plan view of FIG. 3c.

Referring to FIGS. 3a–3d, a high-speed optical modulator is illustrated by using a junction field-effect device 300 which is normally in the on mode, for example. The device 300 is based on a p-type DMS material 302 having ferromagnetic region A between the two n-type contacts 304 and 306 based on n-GaAs. Under elements 304 and 306, which can be called gate electrodes, depletion regions 308 and 310 are formed, these depletion regions also comprising paramagnetic domains. Gate electrodes 304 and 306 have metal contacts 328 and electrical leads 320 and 322 respectively leading therefrom and are connectable to a voltage source or emf 316 through switch 318. Linearly polarized light is directed at the ferromagnetic region A as illustrated in FIG. 3b the incident light being illustrated at 312 and the reflected light at 314 as illustrated in FIG. 3a. It can be seen that the incident light and the reflected light are in planes that are rotated with respect to one another. Referring to FIG. 3c, when the gates (304 and 306) are biased above a pinched-off $V_g$ voltage, the region A which formerly comprised a ferromagnetic region is depleted of holes and is converted into a paramagnetic region as illustrated in FIG. 3d and incident linearly polarized light 312 and the reflected polarized light 314 are in planes parallel to one another. This change in polarization can be detected and measured in the same manner as previously described in FIGS. 2a–2c. By switching the voltage on and off, polarization rotation can be changed with the same switching rate as the voltage between off-parallel and parallel, which represent optically 1 (on) and 0 (off). This allows transmitting data information digitally by optical communication. In other words, the device can be utilized as a data transmitter in optoelectronic integrated systems and circuits.

A normally-on type device 400 as illustrated in FIGS. 4a–4d may be used according to the present invention by generating paramagnetic domains in the layer 406 which principally comprises a DMS material having ferromagnetic domains. The electromagnet is energized (H=200 Oe) and by positive bias application (V=5 V), holes in the $p^+$-layers are depleted, resulting in a magnetic phase transition from ferromagnetism to paramagnetism. In this mode of operation $M_p = xH - 0$ (virtually 0). The band diagrams FIGS. 4b and 4d graphically illustrate the change thus obtained. The device of FIGS. 3a, 4a and 5a in addition to the optical modulator, can be made to function in a read mode and a write mode in the same way as the device of FIG. 2a as described herein either by the utilization of polarized light or by measuring Hall resistance or Hall voltage. Hall measurements (either voltage or resistance) are readily obtained with the devices of FIGS. 4a and 5a by positioning an additional drain contact or source contact in the device. For example, in referring to FIG. 4a, an additional drain contact identical to drain contact 418 and 420 can be placed adjacent to layer 410 and 408. Similarly, in referring to FIG. 5a, a source contact identical to source contact 518–520 can be placed adjacent to layers 510 and 508. With these contacts (either drain or source contacts, depending on the device), Hall measurements may then be made in a conventional manner.

Additionally, laser light may be used as the electromagnetic energy for measuring the properties of the apparatus of the present invention when in the read mode and the write mode, such as an optical modulator. By way of example, and referring to FIGS. 5a and 5d, laser light may be passed/or reflected through the metallic contact layer 510, the gate insulator or insulator layer 508, the $p^-$-type or n-type layer 508 and the layers 504 and 502 and the laser energy transmitted through the device passed through a polarizer or filter and into a light sensor or detector. Any change in rotation of the laser light can be measured at the detector when the voltage is switched off and the voltage switched on is translatable into the read mode (or 1 in a binary code) and the write mode (0 in a binary code) of the device.

Although the invention has been described by reference to some embodiments, it is not intended that the novel apparatus and method be limited thereby but that modifications are intended to be included as falling within the broad spirit and scope of the foregoing written description, the claims and the attached drawings.

Having thus described my invention, what I claim as new, and desire to be secured by Letters Patent is:

1. An apparatus for controlling the magnetic properties of a semiconductor material in a selected region comprising:
    (a) a diluted magnetic semiconductor material;
    (b) first means including a non-ferromagnetic electrode for generating an electric field in said selected region for generating carriers in said selected region of said material;
    (c) second means for controlling said carrier concentrations in said selected region of said material above and below or across a critical value to achieve a carrier-induced magnetism such that a magnetic state of said selected region can be changed from a first magnetic state to a second magnetic state; and
    (d) magnetic means for applying a magnetic field in at least a portion of said electrode to substantially magnetize said portion of said selected region in said first or second magnetic state.

2. The apparatus of claim 1, wherein said first means includes means adapted for coupling to a first reference potential.

3. The apparatus of claim 2, wherein said second means further includes an insulating layer positioned between said electrode and said material.

4. The apparatus of claim 2, wherein said second means further includes an insulating III-V semiconductor layer positioned between said electrode and said material.

5. The apparatus of claim 1, wherein said material includes an anamalous Hall material.

6. The apparatus of claim 1, wherein said material includes CdHgMgTe compounds.

7. The apparatus of claim 1, wherein said material includes PbMnTe compounds.

8. The apparatus of claim 1, wherein said material includes (In,Mn)As.

9. The apparatus of claim 1, wherein said material includes (Ga,Mn)As.

10. The apparatus of claim 1, wherein said material includes (Ga,Fe)As.

11. The apparatus of claim 1, wherein said material includes (Zn,Fe)Se.

12. The apparatus of claim 1, wherein said material includes compounds including (In,Ga,Mn)As.

13. The apparatus of claim 1, wherein said material includes $Si_{1-x}Mn_x$.

14. The apparatus of claim 1, wherein said material includes compounds including $(SiGe)_{1-y}Mn_y$.

15. The apparatus of claim 1, wherein said material includes compounds including an element from Group IV of the Periodic Table.

16. The apparatus of claim 1, wherein said material includes an element from Group III, an element from Group V, and at least one transition element having atomic numbers 21-28.

17. The apparatus of claim 1, wherein said material includes an element from Group II, an element from Group VI, and at least one transition element having atomic numbers 21-28.

18. A method of changing a magnetic state of a specific area defined by a non-ferromagnetic electrode on a III-V DMS material and non-volatilely storing the changed magnetic state comprising the steps of:
    (a) applying an electrode field to selected regions of said material for generating/annihilating a sufficient amount of carriers above or below a critical value to achieve a carrier-induced magnetism such that the magnetic state of said selected region is measurably changed from a first magnetic state to a second magnetic state; and
    (b) applying a magnetic field on said selected region while said electric field is being applied to permanently magnetize said selected region in said second magnetic state.

19. The method of claim 18 wherein said III-V DMS material includes at least one transition element having atomic numbers 21-28.

20. The method of claim 19 wherein said III-V DMS material is based on at least one of the Group III elements Ga or In, the Group V element As, and at least one of the transition elements Co, Fe, Mn.

21. The method of claim 20 wherein said transition element is at least Mn.

22. A method of switching a non-volatile DMS device from a first magnetic state to a second magnetic state and reading said second magnetic state comprising the steps of:
    (a) applying a bias signal to selected regions of said DMS device to change the magnetic state in said selected regions from a first magnetic state to a second magnetic state;
    (b) applying a magnetic field to said selected regions of said DMS device while said bias signal is being applied to permanently magnetize said selected regions in said second magnetic state;
    (c) removing said bias and said magnetic field such that said device non-volatilely retains said second magnetic state;
    (d) applying an electromagnetic signal to said device;
    (e) measuring any alteration of said electromagnetic signal after applying it to said device to thereby read said second magnetic state.

23. The method of claim 22 wherein said electromagnetic signal is polarized light reflected from the surface of said changed magnetic state in said device.

24. The method of claim 22 wherein said electromagnetic signal is laser or polarized light passed through said changed magnetic state in said device.

25. The method of claim 22 wherein said electromagnetic signal is an emf passed though said changed magnetic state in said device.

26. The method of claim 22 wherein said device includes a p-n junction or a heterojunction or a p-n heterojunction.

27. The method of claim 22 wherein said device is based on an anomalous Hall effect material.

28. The method of claim 27 wherein said electromagnetic signal applied to said device is laser or polarized light passed through or polarized light reflected from the surface of said changed magnetic state or an emf passed through said changed magnetic state.

29. The method of claim 22 wherein said device is based on a III-V DMS material.

30. The method of claim 22 wherein said device is based on a II-VI DMS material.

31. The method of claim 22 wherein said device is based on a DMS material containing a Group IV element.

32. The method of claim 22 wherein said device is based on a IV-VI DMS material.

33. The apparatus of claim 1 further including third means for removing said magnetic field.

34. The apparatus of claim 33 further including:
fourth means for passing an electrical current through said portion of said selected region; and
fifth means for monitoring the voltage across the portion of the selected region transverse to the direction of the electrical current.

35. An apparatus for sensing the magnetic properties of a semiconductor material in a selected region comprising:
(a) a diluted magnetic semiconductor material;
(b) first means including a non-ferromagnetic electrode for generating an electric field in said selected region for generating carriers in said selected region of said material;
(c) second means for controlling said carrier concentrations in said selected region of said material above and below or across a critical value to achieve a carrier-induced magnetism such that a magnetic state of said selected region can be changed from a first magnetic state to a second magnetic state;
(d) magnetic means for applying a magnetic field in at least a portion of said electrode to substantially magnetize said portion of said selected region in said first or second magnetic state;
(e) third means for removing said magnetic field;
(f) fourth means for passing an electrical current through said portion of said selected region; and
(g) fifth means for monitoring the voltage across said portion of said selected region transverse to said direction of said electrical current.

36. The method of claim 18 further including the step of removing said electric field and said magnetic field such that said second magnetic state is non-volatilely retained in said selected region.

37. A magnetic apparatus for controlling the magnetic properties of a diluted magnetic semiconductor material in a selected region comprising:
(a) a diluted magnetic semiconductor material having a first magnetic state;
(b) two spaced non-ferromagnetic gate electrodes disposed on said material, first and second depletion regions disposed beneath each of said electrodes, said electrodes being comprised of a compound semiconductor material, said first and second depletion regions having a second magnetic state; and
(c) means for biasing said two gate electrodes above a pinch off voltage to remove carriers from a selected region between said electrodes, said electrodes controlling said carrier concentrations in said selected region above and below a critical value to achieve carrier-induced magnetism to change said selected region to said second magnetic state.

38. The magnetic apparatus of claim 37, wherein each of said gate electrodes and said DMS material form a homojunction.

39. The magnetic apparatus of claim 37, wherein each of said gate electrodes and said DMS material form a heterojunction.

40. The magnetic apparatus of claim 39, wherein said heterojunction is a p-n junction.

41. The magnetic apparatus of claim 40, wherein said compound semiconductor material for each of said electrodes is n type GaAs and said DMS material is a p type DMS material.

42. The magnetic apparatus of claim 40, wherein said compound semiconductor material for each of said gate electrodes is n type InGaAs and said DMS material is a p type DMS material.

* * * * *

UNITED STATES PATENT AND TRADEMARK OFFICE
CERTIFICATE OF CORRECTION

PATENT NO. : 5,191,223
DATED : March 2, 1993
INVENTOR(S) : Hiroo Munekata

It is certified that error appears in the above-identified patent and that said Letters Patent is hereby corrected as shown below:

On the Title Page, Section [54]: before "DEVICE" insert --NOVEL--

Column 4, line 39: "$T_x$" should read --$T_s$--

Column 5, line 16: "$T_x$" should read --$T_s$--

Column 10, line 8: after "switchably" insert --biased--

Column 15, line 49, Claim 6: "CdHgMgTe" should read --CdHgMnTe--

Column 16, line 13, Claim 18: "electrode" should read --electric--

Signed and Sealed this

Twenty-third Day of November, 1993

Attest:

BRUCE LEHMAN

*Attesting Officer*  *Commissioner of Patents and Trademarks*